United States Patent [19]

Dubin et al.

[11] Patent Number: 4,717,639

[45] Date of Patent: Jan. 5, 1988

[54] PROCESS FOR PREPARATION OF A STENCIL OR RESIST IMAGE

[75] Inventors: Alan S. Dubin, Greenville, Del.; Robert A. McMillen, Downingtown, Pa.; R. David Mitchell, Wilmington, Del.

[73] Assignee: E. I. Du Pont De Nemours and Company, Wilmington, Del.

[21] Appl. No.: 805,525

[22] Filed: Dec. 6, 1985

[51] Int. Cl.$^4$ .................. G03G 13/20; B05D 3/02; B05D 3/10; B05D 5/12

[52] U.S. Cl. .................. 430/124; 156/659.1; 156/902; 156/904; 204/15; 427/96; 427/98; 427/259; 427/307; 430/109

[58] Field of Search .................. 430/49, 124, 109; 427/197, 399, 259, 98, 96, 307; 148/6, 6.14 R; 156/656, 659.1, 902, 901, 904; 204/15

[56] References Cited

U.S. PATENT DOCUMENTS

| | | | |
|---|---|---|---|
| 4,078,102 | 3/1978 | Bendz et al. | 427/259 X |
| 4,157,936 | 6/1979 | Piazza | 427/259 X |
| 4,537,799 | 8/1985 | Dorey et al. | 427/259 |

FOREIGN PATENT DOCUMENTS 2169416A 7/1986 United Kingdom .

*Primary Examiner*—Evan K. Lawrence

[57] ABSTRACT

Process for formation of a hardened, insoluble or crosslinked stencil or resist image on a substrate, e.g., having a metal surface such as copper, and modifying the substrate or image surface comprising:

A. forming an image on the substrate by applying a solvent-soluble thermoplastic copolymer of ethylene and $\alpha,\beta$-ethylenically unsaturated acid having an acid number of at least about 30, the copolymer reacting thermochemically with the substrate;

B. fusing at a temperature and for a duration to induce the thermochemical reaction at a rate sufficient to partially insolubilize, harden or crosslink the polymeric image and adhere the polymeric image to the substrate surface to facilitate subsequent removal therefrom;

C. modifying the uncovered substrate surface or the polymeric image surface, e.g., etching, plating, depositing, soldering; and D. removing the polymeric image.

The image can be formed on the substrate by printing, electrostatic means, etc. The image may comprise particulate material having a plurality of fibers. The process is useful in making conductive printed circuits, chemical milling, etc.

21 Claims, No Drawings

PROCESS FOR PREPARATION OF A STENCIL OR RESIST IMAGE

DESCRIPTION

1. Technical Field

This invention relates to a process for the formation of a stencil or resist image on a substrate and modifying the substrate surface or image surface. More particularly this invention relates to a process whereby a polymeric stencil or resist image is fused on a surface that reacts thermochemically with the polymer image at a rate of reaction which facilitates removal or stripping of the polymeric image.

2. Background Art

Printed circuits, printing plates and chemically milled items are commonly made by depositing a resist on a substrate either in the form of the desired pattern or as an overall covering followed by removal of some resist to form the desired pattern, followed by modification of the bare adjacent areas of the substrate through etching or plating.

Conventional printing methods such as letterpress, lithography, and gravure printing have been found to be deficient for resist printing, however, because they are only capable of printing a thin resist. Thin resist patterns tend to be full of pinholes which lead to unacceptable quality upon subsequent etching or plating. This is a particularly severe problem in plating because of the formation of plating nodules over pinholes in the resist. Use of liquid photoresists presents the same problem:

Two methods are now in commercial use-screen printing and photoprinting-because they are able to deposit pinhole-free resist patterns. Photoprinting, as described in Celeste U.S. Pat. No. 3,469,982, requires the lamination and subsequent exposure and development of each substrate with a suitable photopolymer. While this process provides the highest quality resist and has many advantages, the expense of the materials and exposure and development steps detract from low cost rapid reproduction. Screen printing is low in ink cost but it requires a costly set-up for the master; furthermore, it has only been implemented as a flat-bed process requiring extensive operator interaction to maintain registration and correct ink viscosity. The screening also limits edge definition. Further, the process requires post-curing.

Attempts have been made to apply xerography (electrophotographic printing or imaging by electrostatically-held toner) to the resist art. By way of background in the xerography art, thermal transfer of electrostatic toner to paper has been practiced in the past. Generally, the heat was applied after the transfer of the toner, as described in U.S. Pat. Nos. 2,990,278; 3,013,027; 3,762,994; 3,851,964 and 4,015,027. Simultaneous heating and transfer of electrostatic toner to paper is disclosed in U.S. Pat. No. 3,592,642. U.S. Pat. No. 2,917,460 discloses the melting of the electrostatic toner on the paper surface so that the molten droplets so formed may be absorbed in the interstices of the paper to make a permanent image on the paper.

The above-described prior art is directed to porous substrate surfaces having substantial interstices.

As applied to the resist art, however, xerography has taken a different approach from thermal transfer. U.S. Pat. No. 2,947,625 discloses formation of an electrostatically-held image of toner, transfer of this image to a wet gelatin-coated paper using pressure which imbeds the toner in the gelatin coating, and exposing the toner image to the softening action of solvent vapors, and pressing the solvent vapor-softened toner image against a printed circuit board to transfer a stratum of the resultant tacky image to the board, and finally subjecting the transferred image to more solvent vapors or heat to coalesce the image, which is then purportedly available as an etching resist. U.S. Pat. No. 3,061,911 discloses a similar process except that the image is transferred from the transfer paper to the circuit board by electrical charging and the resultant transferred image is fused by exposure to solvent vapor. A transfer process has been commercialized with only limited success, involving electrostatic transfer of an image of electrostatically held toner to a tissue, electrostatically transferring the image from this tissue to a circuit board, and fusing the image with solvent vapor.

Recently it has been attempted to form a polymeric resist image on a substrate by electrostatic means. This process uses a liquid toner to form an electrostatic resist image which is transferred to a metallized surface. e.g., aluminized Mylar ®, followed by heat fusing the resist image. The areas of the metallized surface uncovered by the resist are subsequently etched away. The resist image is then removed by treatment with hot solvent. While in the laboratory a conductive pattern of the same image quality as the original toned image is said to be achieved on the aluminum surface, the adhesion achieved by the fused resist image is not sufficient to make an acceptable printed circuit. When a fused resist image is formed on a copper substrate, however, an extremely adhered resist image is formed implying a thermochemical reaction between the polymeric resist and the surface of the substrate. It is postulated that due to this thermochemical reaction the resist image cannot be removed by the usual stripping solutions for the polymeric resist.

There is a need for a process whereby a polymeric stencil or resist image can be formed on a substrate and fused adhesively thereto by a thermochemical reaction at a rate of reaction which facilitates removal or stripping of the polymeric image, if desired, after the areas of the substrate not covered by the resist image have been modified by etching or plating or the polymeric resist image is modified.

SUMMARY OF THE INVENTION

In accordance with this invention there is provided a process for the formation of a hardened, insoluble or crosslinked polymeric stencil image on a substrate and modifying the surface of the substrate or image surface comprising:

A. forming an image on a substrate by applying a solvent-soluble thermoplastic copolymer of ethylene and an $\alpha,\beta$-ethylenically unsaturated acid having an acid number of at least about 30 to a surface of the substrate that reacts thermochemically with the copolymer;

B. fusing at a temperature and for a duration to induce the thermochemical reaction at a rate of reaction sufficient to partially insolubilize, harden or crosslink the polymeric image and adhere the polymeric image to the substrate surface to facilitate subsequent removal therefrom;

C. modifying either the uncovered substrate surface or the polymeric image surface; and D. removing the polymeric image from the substrate surface.

In accordance with a preferred embodiment of this invention there is provided a process for the formation of a resist image on a copper surface and modifying the copper surface comprising:

A. applying by electrostatic means a toned particulate image to the copper surface, the particulate image comprising particles less than 10 μm in diameter of a thermoplastic copolymer of ethylene and an α,β-ethylenically unsaturated acid having an acid number of at least about 30, and optionally a colorant:

B. fusing the particulate image at a temperature and for a duration to induce a thermochemical reaction at a rate of reaction sufficient to partially insolubilize, harden or crosslink and adhere the particulate image to the copper surface to facilitate subsequent removal therefrom to form a stencil resist image;

C. modifying the uncovered copper surface by a treatment taken from the group consisting of etching, plating, depositing and soldering; and D. removing the fused particulate image from the substrate surface.

The process of this invention results in forming a polymeric stencil or resist image on a substrate and modifying the surface of the substrate or image surface. As a first step a polymeric image can be formed on the substrate by various means such as by printing, e.g., with a screen, ink jet, plotting pen, magnetic means, etc., or preferably by electrostatic means as more fully described below. The substrate bearing the polymeric image has at least a metal surface of copper which is preferred, zinc, chromium, cadmium, nickel, etc. The polymeric image can be adhered to other metals and substrates as well, but the thermochemical adhesion thereto is markedly less than to the previously named metals.

DESCRIPTION OF THE PREFERRED EMBODIMENTS

The polymers used to form the polymeric image are thermoplastic copolymers having an acid functionality wherein the acid number is at least about 30. Useful polymers include: copolymers of ethylene and an α,β-ethylenically unsaturated acid selected from the class consisting of acrylic acid and methacrylic acid, interpolymers of ethylene (80 to 94.9%)/acrylic or methacrylic acid (20 to 5.1%)/alkyl ester of acrylic or methacrylic acid wherein alkyl is 1 to 5 carbon atoms (0 to 15%). Surlyn ® ionomer resin by E. I. Du Pont de Nemours and Company, Wilmington, Del., etc. The synthesis of polymers of this type are described in Rees U.S. Pat. No. 3,264,272, the disclosure of which is incorporated herein by reference. For the purposes of preparing the preferred polymers or interpolymers, the reaction of the acid containing copolymer with the ionizable metal compound, as described in the Rees patent, is omitted. The ethylene constituent is present in about 80 to 94% by weight of the copolymer and the acid component in about 20 to 5.1% by weight of the copolymer. The acid numbers of the copolymers range from 30 to 120, preferably 54 to 90. Acid No. is milligrams potassium hydroxide required to neutralize 1 gram of polymer. The melt index (g/10 min) of 10 to 500 is determined by ASTM D 1238 Procedure A. A particularly preferred copolymer is prepared from ethylene (89%)/methacrylic acid (11%) wherein the acid number is 66 having a melt index at 190° C. of 100.

Other acid containing interpolymers may be used provided they are thermoplastic, film forming and have an acid number of at least 30. Examples of such interpolymers are disclosed in Leberzammer et al. U.S. Pat. No. 4,353,978, Gilano et al, U.S. Pat. No. 3,887,450, Faust U.S. Pat. No. 3,804,631 and Faust et al. U.S. Pat. No. 3,930,865. Such interpolymers may have as the major component alkyl acrylates or methacrylates, styrene, etc. Likewise the acid moiety may be of maleic or maleate type.

Optionally additional components can be present with the copolymer, e.g., colorant dye or pigment including metal powders, charge director, polyethylene, fine particle size oxides such as silica, metal oxides, electroless plating catalysts, etc. The copolymer can be dissolved in suitable solvent, therefor as known to those skilled in the art when application to the substrate is by printing technique or when application is by electrostatic means can be dispersed at elevated temperature with a nonpolar liquid having a Kauri-butanol value of less than 30 determined by ASTM D 1133. The dispersion preferably contains toner particles having an average (by area) particle size of 0.1 to less than 10 μm.

The nonpolar dispersant liquids are, preferably, branched-chain aliphatic hydrocarbons and more particularly, Isopar ®-G, Isopar ®-H, Isopar ®-K, Isopar ®-L, and Isopar ®-M. These hydrocarbon liquids are narrow cuts of isoparaffinic hydrocarbon fractions with extremely high levels of purity. For example, the boiling range of Isopar ®-G is between 157° C. and 176° C. Isopar ®-H between 176° C. and 191° C. Isopar ®-K between 177° C. and 197° C., Isopar ®-L between 188° C. and 206° C. and Isopar ®-M between 207° C. and 254° C. Isopar ®-L has a mid-boiling point of approximately 194° C. Isopar ®-M has a flash point of 80° C. and an auto-ignition temperature of 338° C. Stringent manufacturing specifications, such as sulphur, acids, carboxyl, and chlorides are limited to a few parts per million. They are substantially odorless, possessing only a very mild paraffinic odor. They have excellent odor stability and are all manufactured by the Exxon Corporation. High-purity normal paraffinic liquids, Norpar ®12, Norpar ®13 and Norpar ®15, manufactured by Exxon Corporation, may also be used. These hydrocarbon liquids have the following flash points and auto-ignition temperatures:

| Liquid | Flash Point (°C.) | Auto-Ignition Temp (°C.) |
|---|---|---|
| Norpar ® 12 | 69 | 204 |
| Norpar ® 13 | 93 | 210 |
| Norpar ® 15 | 118 | 210 |

All of the dispersant liquids have an electrical volume resistivity in excess of $10^9$ ohm centimeters and a dielectric constant below 3.0. The vapor pressures at 25° C. are less than 10 Torr. Isopar ®-G has a flash point, determined by the tag closed cup method, of 40° C., Isopar ®-H has a flash point of 53° C. determined by ASTM D 56. Isopar ®-L and Isopar ®-M have flash points of 61° C., and 80° C., respectively, determined by the same method. While these are the preferred dispersant liquids, the essential characteristics of all suitable dispersant liquids are the electrical volume resistivity and the dielectric constant. In addition, a feature of the dispersant liquids is a low Kauri-butanol value less than 30, preferably in the vicinity of 27 or 28. The ratio of thermoplastic resin to dispersant nonpolar liquid is such that the combination of ingredients becomes fluid at the working temperature.

While not being limited to any particular process for the preparation of the dispersed toner particles, one method is known wherein the ingredients are placed into a suitable vessel, e.g., attritor, heated ball mill, heated vibratory mill such as a Sweco Mill Mfg. by Sweco Co., Los Angeles, Calif., equipped with particulate media for dispersing and grinding. Generally all are placed in the vessel prior to start of the dispersing step although after homogenizing the resin and the dispersant nonpolar liquid a colorant can be added, if desired. The dispersing step is generally accomplished at elevated temperature, i.e., the temperature of ingredients in the vessel being sufficient to plasticize and liquify the resin but being below that at which the nonpolar liquid boils and the resin and/or colorant decomposes. A preferred temperature range is 80° to 120° C. Other temperatures outside this range may be suitable, however, depending on the particular ingredients used. The presence of the irregularly moving particulate media in the vessel surprisingly is essential to prepare the dispersion of toner particles. Useful particulate media are particulate materials, e.g., spherical, cylindrical, etc. taken from the class consisting of stainless steel, alumina, ceramic, zirconium, silica, and sillimanite. A typical diameter range for the particulate media is in the range of 0.04 to 0.5 inch (1.0 to ~13 mm).

After dispersing the ingredients in the vessel with the particulate media for a period of about 0.5 to 2 hours with the mixture being fluid, the dispersion is cooled, e.g., 0° C. to 50° C. by circulating cold water or a cooling material through an external cooling jacket as is known to those skilled in the art, to permit precipitation of the resin out of the dispersant. It is important that the particulate media be maintained in continuous movement, creating shear and/or impact, during and subsequent to cooling, whereby toner particles of the desired average (by area) particle size, e.g., less than 10 $\mu$m. It has been found that by this method toner particles having a plurality of fibers are formed. After cooling and separating from the particulate media, it is possible to reduce the concentration of the toner particles in the dispersion, impart an electrostic charge of predetermined polarity to the toner particles, or a combination of these variations.

The concentration of the toner particles in the dispersion is reduced by the addition of additional nonpolar liquid as described previously above. The dilution is conducted to reduce the concentration of toner particles to between 0.1 to 3 percent by weight. preferably 0.5 to 2 weight percent with respect to the nonpolar liquid. The toner particles resulting have an average (by area) particle size of 0.1 to less than 10 $\mu$m. e.g., as determined by a Horiba CAPA-500 centrifugal particle analyzer described above or other comparable apparatus.

One or more charge directors as known to those skilled in the art can be added to impart a positive or negative charge as desired. The charge director may be added at any time during the process. If a diluting nonpolar liquid is also added, the charge director can be added prior to, concurrently with or subsequent thereto. Generally 1 to 100 mg/g toner solids of the charge director is required. Suitable positive charge directors are sodium dioctylsulfosuccinate (manufactured by American Cyanimid Co.), zirconium octoate and metal soaps such as copper oleate, etc. suitable negative charge directors are lecithin, barium petronate, calcium petronate (Witco Chemical Corp., New York, N.Y.). alkyl succinimide (manufactured by Chevron Chemical Company of California), etc. The conductivity which has proven particularly useful is in the range of about 5 to 100 pmho/cm. The dispersion having a concentration of toner particles is separated from the particulate media by means known to those skilled in the art.

Optionally colorants, e.g., dyes, pigments including finely divided metal powders, can be present in the polymeric composition. In the preparation of resists it is not necessary that colorants be present although sometimes they are desirable for visually seeing the resist image more readily. Useful dyes known to those skilled in the art include those which when dispersed in the acid polymer do not substantially reduce its acid number. Useful pigments include: Monastral ® Blue G (C.I. Pigment Blue 15 C.I. No. 74160). Toluidine Red Y (C.I. Pigment Red 3). Quindo ® Magents (Pigment Red 122). Indo ® Brilliant Scarlet (Pigment Red 123, C.I. No. 71145). Toluidine Red B (C.I. Pigment Red 3), Watchung ® Red B (C.I. Pigment Red 48), Permanent Rubine F6B13-1731 (Pigment Red 184), Hansa ® Yellow (Pigment Yellow 98). Dalamar ® Yellow (Pigment Yellow 74, C.I. No. 11741). Toluidine Yellow G (C.I. Pigment Yellow 1). Monastral ® Blue B (C.I. Pigment Blue 15), Monastral ® Green B (C.I. Pigment Green 7), Pigment Scarlet (C.I. Pigment Red 60), Auric Brown (C.I. Pigment Brown 6), Monastral ® Green G (Pigment Green 7), Carbon Black, Cabot Mogul L (Black Pigment C.I. No. 77266) and Stirling NS N 774 (Pigment Black 7. C.I. No. 77266). A useful amount of colorant is that which is sufficient to render the resist image visible on the substrate background, e.g., up to 50% by weight based on the weight of polymer. Metal powders, e.g., in the order of 0.5 $\mu$m or less particle size can be present dispersed in the polymeric composition particularly if the polymeric image is to be modified, e.g., by electroless plating. Examples of metal powders include: Cu, Sn, Fb, Ag, Au, Fd, Fe or mixtures thereof. Similarly electroless plating catalysts in powder form can be incorporated into the polymeric composition, e.g., CuO.

After the polymeric composition is prepared it can be applied to the substrate in the form of an image by printing or electrostatic means stated above and described more fully in the Examples below. One electrostatic means is to charge a copier such as a Savin 870 copier and make a toner image on a substrate as described above. Another electrostatic means is to utilize on a copier drum an electrostatic master of a photopolymer printing plate which has been imagewise exposed and solvent developed in a conventional manner and has been charged in the photopolymerized areas and toned with the dispersed toner composition described above. The toned master is installed in a fixture where it forms a nip with a bias transfer roll of about the same diameter covered with a sheet of paper, e.g., K&E Albanene 18 lb. vellum paper or comparable paper. A gap of 0.0025 to 0.004 inch (0.064 to 0.1 mm) is maintained. The bias roll is then positively charged, e.g., potential of 750 to 900 volts while the toned master is held at ground potential nonpolar liquid such as Isopar ®-H is introduced at the nip to ensure a meniscus between the two rolls during transfer. The toned image is transferred to the paper on the bias roll. On the fixture is a linear motion stage with a flat mounting plate having a plane parallel to the axes of the fixture rolls. The substrate is affixed to the mounting plate. In operation, sufficient nonpolar liquid, e.g., Isopar ®-H, is applied to the flat substrate to form a meniscus between the bias roll and the substrate. The bias roll voltage is negative 750 to 900 volts and the flat plate and substrates are grounded. The toned image upon activation is transferred and formed on the flat substrate. The plate with the substrate attached thereto can be fused, e.g., in a convention oven or by other suitable fusing means.

After the polymeric image is formed on the substrate the fusing is conducted at a temperature and for a duration to induce a thermochemical reaction at a rate of reaction sufficient to insolubilize, harden or crosslink the polymeric image to the substrate surface. Obviously the thermochemical reaction can be too severe due to too high a temperature and the polymeric image cannot be effectively removed from the substrate. Since each polymeric image is different due to differences in composition, in order to insure removal from the substrate by stripping, the fusing must be conducted at a rate of reaction sufficient to partially insolubilize, harden or crosslink the polymeric image. Example 3 below illustrates fusing a polymeric resist toner to a copper clad-/epoxy laminate at various temperatures for various lengths of time. It is essential that the fusing time to achieve the desired etch resistance not exceed the maximum fusing time for stripping. These times can readily be determined for different polymeric images and substrates by the procedure shown in Example 3. For the particular polymeric image illustrated in Example 3 a fusing time of 121° C. or less for 60 seconds or less is feasible.

Subsequent to fusing the polymeric image, the uncovered substrate surface can be modified by etching, plating, depositing or soldering or the polymeric image can be modified by electroless plating. The modification techniques of the uncovered substrate surface are well known to those skilled in the art and are described in "Printed Circuits Handbook," Clyde F. Coombs, Editor. Second Edition McGraw-Hill Book Company, New York, N.Y., 1979: Section 2, Chapter 8 for etching; Section 2, Chapter 7 for plating; Section 4 for soldering; and in "Photoresist Materials and Processes, W. S. DeForest, McGraw-Hill Book Company, New York, N.Y. 1975. The disclosures of these publications are incorporated herein by reference.

In order to make useful printed circuits, chemically milled objects and printing plates, it is generally necessary to remove the resist image which remains after modification as set out above. This is normally accomplished by a procedure known to the trade as stripping. In addition to stripping solvents and procedures described in the examples below, other stripping compositions and procedures are described in Section 2, Chapter 8, paragraphs 6 and 7 of Coombs, set forth above. The particular useful stripping compositions, of course, depend on the particular polymeric image and the fusing conditions. A preferred mode of the invention is described in Examples 3 and 4.

INDUSTRIAL APPLICABILITY

The process of this invention results in the formation of a fused polymeric stencil or resist image on a substrate, typically, a copper clad printed circuit substrate or other support, which can be modified, such as by plating, etching, depositing. soldering, etc. The polymeric image can be formed by printing, e.g., screen printing, ink jet, plotting pen. magnetic means, electrostatic means, etc. The adhesion of the polymeric image to the substrate is excellent. The resist image is tough and is not degraded by etching solutions. The image quality is good. If desired, depending on the rate of the thermochemical reaction between the substrate surface and the polymeric image, the polymeric image can be removed by stripping. Useful printed circuits, chemically milled items, such as metal gears and other parts, and printing plates, e.g., lithographic plates, can be obtained from the process. The resist can be used with digital or analog systems.

EXAMPLES

The following examples wherein the parts and percentages are by weight illustrate but do not limit the invention.

RESIST TONER PREPARATION 500 grams of a copolymer of ethylene (89%)/methacrylate acid (11%) melt index at 190° C. is 100, Acid No. is 66, and 500 grams of Isopar ®-L, nonpolar liquid having Kauri-butanol value of 27, Exxon Corp., are combined at 78° C. in a Ross planetary mixer. After mixing for thirty minutes, 125 grams of Mogule ® carbon black C.I. No. 77266 Cabot Corp., Carbon Black Division, Boston, Mass., were added, and mixing was continued for an hour at 82° C. At this time, the addition of 1000 grams of ISOPAR ®-L was started and continued for one hour. The material was cooled to room temperature while stirring. 28.8 grams of this material were ground with 171.2 grams of ISOPAR ®-H, nonpolar liquid having a Kauri-butanol value of 27, Exxon Corp., for a period of 12 hours in a Type 0-1 attritor. Union Process Company, Akron, Ohio equipped with tap-water cooling and 0.1875 inch (4.76 mm) stainless steel balls. The grinding pulled the polymer particles apart fibers extending therefrom. The concentrate was diluted to 2 percent solids with Isopar ®-H. To 2,000 grams of the diluted solution is added 50 grams of a 5.5% Isopar ®-H solution of basic barium petronate charge director to form a developing liquid.

Control 1

AN ALUMINUM PATTERN USING TONER AS A RESIST IMAGE

A Savin 870 copier charged with resist toner described above was used to make a toner image on aluminized Mylar ®. After fusing in the copier, the exposed metal was etched using an acid etching solution (161 grams cupric chloride dihydrate, 568 mL concentrated hydrochloric acid and 350 mL water). The fused image was then dissolved (hot 1:1 roluene:n-butanol) to give a conductive pattern of the same image quality as the original toned image.

Control 2

TONER ADHESION TO MYLAR ®

Using the toner and copier described in Control 1, a toned and fused image was made on a Mylar ® sheet. When immersed in hot (70° C.) tetrahydrofuran or hot 1:1 toluene:n-butanol the fused image dissolved.

Control 3

TONER ADHESION TO COPPERIZED MYLAR®

Using the toner and copier described in Control 1, a toned and fused image was made on a Mylar® sheet clad with a 200 nm layer of copper metal. When immersed in hot (70° C.) tetrahydrofuran or hot 1:1 toluene:n-butanol the fused image did not dissolve, even with vigorous rubbing.

Controls 1, 2 and 3 demonstrate that adhesion of the fused toner to copper produces an extremely adhesive image, implying a thermochemical reaction of the toner not observed on Mylar® or on Aluminum.

Modified Savin 770 copier

A Savin model 770 office copier was modified by (1) providing variable speed motors and external control of drum and reverse roll speeds. (2) removing the transfer corotron* and disabling the paperfeed. (3) adding external control of the charge corotron voltage, and (4) constructing a drum to which an electrostatic master is clamped on its outside diameter and which replaces the normal selenium photoconductor drum.

*Transfer corotron consists of two fine wires in a framework which supports and positions them in the image transfer zone on the side of the image receptor media (e.g., the paper) opposite the photoreceptor or electrostatic master which carries the toned image and is about 0.25 to 0.38 inch (6.35 to 9.65 mm) away. The wires are raised to a potential about 4 to 7 Kilovolts and of polarity opposite to that of the toner particles of the image. Corona emission resulting from the wires ionizes air molecules and deposits the ionized molecules onto the back side of the image receptor media. Electrostatic forces are thus produced causing the toner particles which form the image to transfer to the image receptor.

An electrostatic master was made by coating Citiplate photopolymer, approximately 0.0001 to 0.0002 inch (0.0025 to 0.0051 mm) thick onto 0.007 inch (0.18 mm) thick aluminum sheet. The master was direct contact imaged through a photographic negative and developed, with the nonimage areas being washed off to expose bare aluminum. The master was clamped to the drum with the aluminum backing connected to ground and installed in the modified Savin 770 where it was charged in the photopolymer areas using a 6000 volt corotron voltage and toned with resist toner at a speed of approximately 0.6 inch (1.52 cm)/sec.

MASTER IMAGE TRANSFER APPARATUS & PROCESS

The drum with the toned master was removed from the modified Savin copier and installed in a second fixture where it formed a nip with a bias transfer roll of approximately the same diameter around which was wrapped a sheet of K&E Albanene 18 lb. vellum paper. A gap of 0.0025 to 0.004 inch (0.0635 to 0.10 mm) was maintained between the toned master and the vellum paper by means of barriers at the ends of each roll. Each roll had a gear at one end which meshed with that of the other roll to achieve synchronous speed. The bias roll was given a positive potential of 750 to 900 volts while the master drum was held at ground potential. Sufficient Isopar®-H was introduced at the nip to ensure a meniscus between the two rolls during transfer. The bias roll was motor driven at approximately 0.5 inch (12.7 mm)/sec. The toned image, still wet, was transferred to the vellum paper on the bias roll.

Also present on the second fixture was a linear motion stage with a flat mounting plate whose plane was parallel to the axes of the two drums. A flat substrate to be printed on was affixed to the top of the mounting plate. The bias roll assembly was supported at each end with parallel arms which were used to swing the roll down into close proximity to the flat substrate image receptor. Strips of 0.0025 inch (0.0635 mm) thick 3M #810 adhesive tape at the outer edges of the flat substrate bore against the master on the bias roll to provide clearance between the two. A gear rack on the side of the mounting plate was meshed with the gear on the end of the bias roll to synchronize the speed. Sufficient Isopar®-H was applied to the flat plate to form a meniscus between the bias roll master and plate. The bias roll voltage was set at a negative 750 to 900 volts and the flat plate was grounded. The bias roll was then motor driven so that it and the flat plate had a surface speed of approximately 0.5 inch (12.7 mm)/sec. The toned image was transferred to the flat plate which was then removed from the fixture and placed in a convection oven at 120 degrees C. where the toned image was fused for a period of time 5 to 10 minutes.

EXAMPLE 1

A flexible resist protected, etched copper printed circuit is prepared using the above described resist toner and the following procedure.

The modified Savin 770 copier charged with the resist toner was used along with the master image transfer process to make a toned image on Mylar® polyester film clad with a 0.0015 inch (0.038 mm) thick copper. After fusing the toned image in a convection oven at 120° C. for 5 minutes, the copper left uncovered by the fused resist image was etched using acidic cupric chloride solution in a DEA Model 2401 etching machine. DEA Products, Inc., Tempe, Ariz. to produce a copper printed circuit pattern covered with the fused toner. The etched sample was then successively run through stripping baths of 3% aqueous KOH bath with and without ethyl Cellosolve® and trichlorethane using an ASA 850 Stripper manufactured by Advanced Systems, Inc., Phoenix, Ariz. None of these baths stripped the toner from the copper. Subsequent hand applications of Isopar®, acetone, and ethyl alcohol would not remove the toner. Immersing the sample successively in tetrahydrofuran and MEK had no effect. Immersion for approximately 15 minutes in heated 1:1 toluene:butanol allowed some but not all of the toner to be wiped off with a cloth. The stripping tests confirm that a thermochemically hardened adherent resist image is formed over the copper circuit pattern.

EXAMPLE 2

A resist-protected, etched, copper printed circuit was prepared from a 0.0015 inch (0.038 mm) thick copper clad 0.014 inch (0.35 mm) thick fiberglass/epoxy laminate using the toner, copier and transfer procedure described in Example 1. Etching as described in Example 1 removed unprotected copper to produce a resist protected printed circuit pattern. Processing the etched board in 3% KOH as described in Example 1 did not remove the fused resist image from the copper circuit pattern.

EXAMPLE 3

Using the toner, copier and transfer process described in Example 1, similar toned circuit images were made on several pieces of the copper clad/epoxy laminate of Example 2. Individual samples were fused at temperatures of 93, 121, and 149 degrees C. at times varying from 5 seconds to 10 minutes. The boards were etched and run though stripping baths of aqueous 3% KOH as described in Example 1. Samples fused at 93 degrees required 180 seconds to achieve etch resistance, but could not be completely stripped if fused over 120 seconds. Samples fused at 121 degrees were etch resistant and could be stripped after 60 seconds fusing, but could not be completely stripped if fused longer. Samples fused at 149 degrees required 10 seconds for etch resistance but no samples fused at 149 degrees could be completely stripped. The fusing time in seconds to achieve etch resistance and the maximum fusing time to still permit stripping is set out in Table 1.

TABLE 1

| | FUSING TIME IN SECONDS TO ACHIEVE | |
|---|---|---|
| TEMP. (°C.) | FUSING TIME FOR ETCH RESISTANCE (SEC) | MAX FUSING TIME FOR STRIPPING (SEC) |
| 93 | 180 | 120 |
| 121 | 60 | 60 |
| 149 | 10 | * |

*NONE OF THE SAMPLES FUSED AT 149° C. COULD BE STRIPPED

As Table 1 illustrates, only one time/temperature combination, 121 degrees for 60 seconds, gave both acceptable etch resistance and strippability on copper using the particular resist toner described so that a useful printed circuit was produced which could be further processed by the introduction of electronic components.

EXAMPLE 4

A plate-and etch printed circuit is prepared using the controlled fusing process of this invention. To a copper clad glass/epoxy substrate similar to that of Example 2 having plated through-holes is applied a reverse circuit image of resist toner using the toner, copier and transfer process of Example 1, except that the master is imaged through a photographic positive of the circuit pattern. The toned copper laminate having an uncovered circuit image with plated through holes is then fused as in Example 3 for 60 seconds at 121° C. The resist coated substrate is dipped into an acid cleaner, Du Pont AC 500 solution, to clean the uncovered copper surface and is rinsed with water. The substrate was then dipped in a 10% fluoroborate solution for one minute and rinsed with water. The uncovered circuit pattern is electrolytically plated with a commercial tin (60)/lead (40) fluoroborate solution and a current density of 15 amps/ft² for 15 minutes. After rinsing in water the resist image is stripped from the copper surface by running it through a bath of 15% Butyl Carbitol, 1% KOH and 84% water using a commercial stripping machine DEA Jet-Spray 6100A manufactured by DEA Products Inc., Tempe, Ariz. After another water rinse, the copper not covered by tin/lead was etched using the etching solution described in Example 1 to produce a printed circuit ready for receiving the electronic components.

EXAMPLES 5 TO 15

The etching and stripping performance of the resist toner fused on different metal substrates is described. In each case, the modified Savin 770 copier charged with the resist toner was used along with the master image transfer process described above to make a toned image on each metal surface. Prior to fusing, a portion of each toned image was tested for stripping by wiping 30 times with a cotton swab saturated with tetrahydrofuran (THF). In each case the toned resist image was stripped from the metal surface. Each toned metal surface was then fused in a convection oven at 120° C. for 15 minutes total. Again a portion of the fused image was tested for stripping in THF using the procedure described above and then the fused resist protected metal surface was etched using the acid etching solution of Example 1 for 2 minutes. After drying the etched image was stripped with THF. Table 2 below summarizes the results for the different metal substrates. "Yes" under "THF STRIP" column heading indicates the image dissolved and "No" indicates that it did not and continued to adhere to the metal surface. "Poor" under the "ACID ETCH" column heading indicates that the resist was degraded from the original and "OK" indicates no degradation observed.

A resist image was formed on all substrate but performance varied. Zinc and chrome gave the best stripping and etching performance along with the copper surface of the previous examples. As described in Example 3 fusing conditions can be controlled to optimize etching and stripping conditions for the zinc and chrome surfaces. Cadmium and nickel gave some indication that a thermochemical reaction was taking place. Presumably fusing conditions can likewise be adjusted to optimize etching and stripping.

TABLE 2

| | | | METAL ADHESION | | | |
|---|---|---|---|---|---|---|
| Example | Metal Surface | Thickness (inch) | Base Support (inch) | THF STRIP | ACID ETCH | THF STRIP |
| 5 | 316 Stainless Steel | .048 | | Yes | Poor | Yes |
| 6 | Lead (40)/ Tin (60) | .050 | Substrate of Ex. 2 | Most | Poor | Most |
| 7 | Brass | .005 | | Yes | Poor | Yes |
| 8 | 1018 Steel | .035 | | Most | Poor | Most |
| 9 | Gold | 125 μin* | 100 μin* Nickel over Copper over 0.035 in. 1018 Steel | Most | Poor | Most |
| 10 | Silver | 125 μin* | Copper over 0.035 in. 1018 Steel | Yes | Poor | Yes |
| 11 | Chrome | 0.0005 | Copper over 0.035 in. 1018 Steel | No | OK | No |
| 12 | Zinc | 0.0005 | 0.035 in. 1018 Steel | No | OK | No |
| 13 | Cadmium | 0.0005 | 0.035 in. 1018 Steel | Some | Poor | Some |
| 14 | Nickel | 0.0005 | 0.035 in. 1018 Steel | Some | Poor | Some |
| 15 | Titanium | 0.025 | | Yes | OK | Most |

*μinch is $10^{-6}$ inch

EXAMPLES 16 TO 30

The fusing and etching performance of variants of ethylene containing polymers and interpolymers when solution coated as films is compared in Table 3 below. In this instance each resin is applied as a 2% tetrahydrofuran (THF) solution using a 0.006 inch (0.152 mm) doctor knife to copperized Mylar ® film described in control 3 and dried to give a coating thickness of about 0.0001 inch (0.0025 mm). Similar coatings were made on Mylar ® polyester film base. Each polymer tested is identified in Table 3 by Monomer Composition. Melt Index which is related to the Polymer MW and is determined at 190° C. and the Acid Number of the polymer. The polymer of Example 16 is the same copolymer used in the "Resist Toner Preparation" for the previous examples.

Each sample was fused for 5 minutes in a convection oven at the temperature indicated in the table and then subjected to the acid-etch test and then the THF stripping test previously described in Examples 5–15.

TABLE 3

ETHYLENE RESIN VARIATIONS ADHESION TO COPPER

| Example | Polymer Composition | Melt Index | Acid No. | Fusing TEMP. °C. | ACID ETCH | THF STRIP |
|---|---|---|---|---|---|---|
| 16 | 89% E, 11% MAA | 100 | 66 | 126 | N | N |
| 17 | 91% E, 9% MAA | 10 | 54 | 136 | N | N |
| 18 | 90% E, 10% MAA | 500 | 60 | 136 | N | N |
| 19 | 85% E, 15% MAA | 60 | 90 | 136 | N | N |
| 20 | 80% E, 10% MAA 10% IBA | 35 | 60 | 132 | N | Y |
| 21 | 91% E, 9% MAA | 3 | 54 | 132 | Some | N |
| 22 | 70% E, 15% MAA 15% IBA | 50 | 90 | 128 | N | Some |
| 23 | 80% E, 5% MAA 15% IBA | 200 | 30 | 134 | Y | Y |
| 24 | 80% E, 5% MAA 15% IBA | 50 | 30 | 132 | Y | Y |
| 25 | 73% E, 10% MAA 17% NBA | 25 | 60 | 132 | N | Some |
| 26 | 86% E, 14% VA | SP95 | | 132 | Y | Y |
| 27 | 95% E, 5% AA | SP108 | | 132 | N | Y |
| 28 | 85% E, 15% VA | SP92 | | 128 | Y | Y |
| 29 | Polyethylene | SP106 | | 128 | N | Y |
| 30 | Surlyn ® 1652 | 5.5 | | 128 | N | Some |

*For the Compositions Listed: E is ethylene, MAA is methacrylic acid, IBA is isobutylacrylate, NBA is n-butyl acrylate, VA is vinyl acetate, AA is acrylic acid, and Surlyn ® 1652 is an ionomer resin manufactured by E. I. du Pont de Nemours and Company, Wilmington, DE, SP means softening point in °C.

In Table 3, "N" for "Acid Etch" indicates the etchant did not remove or degrade the fused polymer while "Y" indicates that it did and "N" for "THF STRIP" indicates that the fused coating did not dissolve or was not removed while "Y" indicates that it did. In evaluating each polymer "N" for both acid etch and THF strip indicates that the thermochemical reaction with the copper surface is occurring and that such a polymer would be useful to make a resist image.

To determine what effect acid etching had on subsequent THF stripping a portion of each fused polymer surface was THF tested prior to the acid etch test. The THF test results in each instance were the same indicating no measurable effect of the etching treatment on the hardening or crosslinking reaction.

Results for the ethylene polymer resins indicate that the polymer should have an acid content of at least about 5%, i.e., an acid number of at least about 30 but that molecular weight is far less critical to produce a useful resist. Factors which seemed to reduce the effectiveness of the resin as tested was the incorporation of butyl acrylate into the polymer chain or precrosslinking the resin prior to use as with Surlyn ®1652. Nevertheless such resins with reduced effectiveness may be useful as resist images by suitable choice of fusing conditions.

Solutions of the type tested in these examples can be used with suitable adjustment of viscosity and/or solvent as inks in applying resist to copper substrates, using ink jet printers, pen or brush applicators, screen printing or any other printing means for applying solid line patterns. From the results of Example 16 the fused resist formed from the coated polymer has equivalent etch and stripping characteristics when compared to a resist formed by electrostatic means as described in Example 3.

We claim:

1. A process for the formation of a hardened, insoluble or crosslinked polymeric stencil image on a substrate and modifying the surface of the substrate or image surface comprising:
   A. forming an image on a substrate by applying a solvent-soluble thermoplastic copolymer of ethylene and an $\alpha,\beta$-ethylenically unsaturated acid having an acid number of at least about 30 to a surface of the substrate that reacts thermochemically with the copolymer;
   B. fusing at a temperature and for a duration to induce the thermochemical reaction at a rate of reaction sufficient to partially insolubilize, harden or crosslink the polymeric image and adhere the polymeric image to the substrate surface to facilitate subsequent removal therefrom;
   C. modifying either the uncovered substrate surface or the polymeric image surface; and
   D. removing the polymeric image from the substrate surface.

2. A process according to claim 1 wherein the polymeric image is formed on the substrate by printing.

3. A process according to claim 1 wherein the polymeric image is formed on the substrate by electrostatic means.

4. A process according to claim 1 wherein the thermoplastic copolymer is a copolymer of ethylene (80 to 94.9%)/acrylic or methacrylic acid (20 to 5.1%)/alkyl ester of acrylic or methacrylic acid wherein alkyl is 1 to 5 carbon atoms (0 to 15%), the percentages being by weight percent of copolymer.

5. A process according to claim 1 wherein the thermoplastic copolymer is a copolymer of ethylene (89%)/methacrylic acid (11%) having a melt index at 190° C. of 100, the percentages being by weight percent of the copolymer.

6. A process according to claim 1 wherein the polymeric image comprises the thermoplastic copolymer and a colorant.

7. A process according to claim 6 wherein the colorant is a dye.

8. A process according to claim 6 wherein the colorant is a pigment.

9. A process according to claim 8 wherein the pigment is a metal powder.

10. A process according to claim 1 wherein at least the surface of the substrate is a metal taken from the group consisting of copper, zinc, chromium, cadmium and nickel.

11. A process according to claim 12 wherein the metal is copper.

12. A process according to claim 1 wherein the uncovered substrate surface is modified by etching.

13. A process according to claim 1 wherein the uncovered substrate surface is modified by plating.

14. A process according to claim 1 wherein the uncovered substrate surface is modified by soldering.

15. A process according to claim 1 wherein the surface of the polymeric image is modified by electroless plating.

16. A process according to claim 3 wherein the polymeric image comprises the thermoplastic copolymer and means for imparting an electrostatic charge.

17. A process according to claim 16 wherein the polymeric image comprises particles of the thermoplastic copolymer having a plurality of fibers.

18. A process according to claim 17 wherein the average thermoplastic copolymer particle has a diameter of less than 10 μm.

19. A process for the formation of a resist image on a copper surface and modifying the copper surface comprising:
  A. applying by electrostatic means a toned particulate image to the copper surface, the particulate image comprising particles less than 10 μm in diameter of a thermoplastic copolymer of ethylene and an $\alpha,\beta$-ethylenically unsaturated acid having an acid number of at least about 30, and optionally a colorant;
  B. fusing the particulate image at a temperature and for a duration to induce a thermochemical reaction at a rate of reaction sufficient to partially insolubilize, harden or crosslink the particulate image and adhere the particulate image to the copper surface to facilitate subsequent removal therefrom, thereby forming a stencil resist image;
  C. modifying the uncovered copper surface by a treatment taken from the group consisting of etching, plating, depositing and soldering; and
  D. removing the fused particulate image by stripping from the substrate surface.

20. A process according to claim 19 wherein the thermoplastic copolymer is a copolymer of ethylene (89%)/methacrylic acid (11%) having a melt index at 190° C. of 100, the percentages being by weight percent of the copolymer.

21. A process according to claim 19 wherein the particulate image comprises particles having a plurality of fibers.

* * * * *

UNITED STATES PATENT AND TRADEMARK OFFICE
CERTIFICATE OF CORRECTION

PATENT NO. : 4,717,639
DATED : JANUARY 5, 1988
INVENTOR(S) : DUBIN, et al.

It is certified that error appears in the above-identified patent and that said Letters Patent is hereby corrected as shown below:

Column 15, line 11, "claim 12" should be --claim 10--.

Signed and Sealed this

Thirty-first Day of May, 1988

Attest:

DONALD J. QUIGG

*Attesting Officer*  Commissioner of Patents and Trademarks